(12) United States Patent
Lam et al.

(10) Patent No.: US 12,695,426 B2
(45) Date of Patent: Jul. 28, 2026

(54) TEMPERATURE CORRECTION FOR RADIO-FREQUENCY CIRCUITS

(71) Applicant: SKYWORKS SOLUTIONS, INC., Irvine, CA (US)

(72) Inventors: Lui Ray Lam, Lexington, MA (US); Andrew Raymond Chen, Newton, MA (US); Min Chu, Lake Forest, CA (US); Tomas J. Tansley, Andover, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 532 days.

(21) Appl. No.: 18/141,205

(22) Filed: Apr. 28, 2023

(65) Prior Publication Data

US 2023/0361720 A1     Nov. 9, 2023

Related U.S. Application Data

(60) Provisional application No. 63/335,780, filed on Apr. 28, 2022.

(51) Int. Cl.
*H03F 1/30* (2006.01)
*H03F 3/213* (2006.01)

(52) U.S. Cl.
CPC ............... *H03F 1/30* (2013.01); *H03F 3/213* (2013.01); *H03F 2200/451* (2013.01)

(58) Field of Classification Search
CPC ...... H03F 1/30; H03F 3/213; H03F 2200/451; H03F 2200/447; H03F 2200/468; H03F 3/245; H03F 3/195

USPC ......................................................... 330/289
See application file for complete search history.

(56) References Cited

U.S. PATENT DOCUMENTS

| | | | |
|---|---|---|---|
| 6,850,746 B1 * | 2/2005 | Lloyd ...................... | H04B 1/28 |
| | | | 455/272 |
| 7,271,658 B2 * | 9/2007 | Matsushita ........... | H03F 1/0211 |
| | | | 330/285 |
| 8,295,790 B2 * | 10/2012 | Koren ................... | H03F 1/3241 |
| | | | 455/114.1 |
| 8,441,320 B2 * | 5/2013 | Signoff ..................... | H03F 1/30 |
| | | | 330/296 |

* cited by examiner

*Primary Examiner* — Andrea Lindgren Baltzell
*Assistant Examiner* — Khem D Nguyen
(74) *Attorney, Agent, or Firm* — Chang & Hale LLP

(57) ABSTRACT

In some embodiments, a radio-frequency system can include a die having a semiconductor substrate and including a radio-frequency circuit and a sensor implemented thereon. The radio-frequency system can further include another die having a semiconductor substrate and including a control circuit for controlling the radio-frequency circuit and a sensor implemented thereon. The control circuit can be configured to receive sensed information from the sensor of the die with the radio-frequency circuit and sensed information from the sensor of the die with the control circuit, and to be capable of adjusting operation of the radio-frequency circuit based on the sensed information from either or both of the sensors. In some embodiments, the radio-frequency system can be implemented as part of a packaged module.

16 Claims, 5 Drawing Sheets

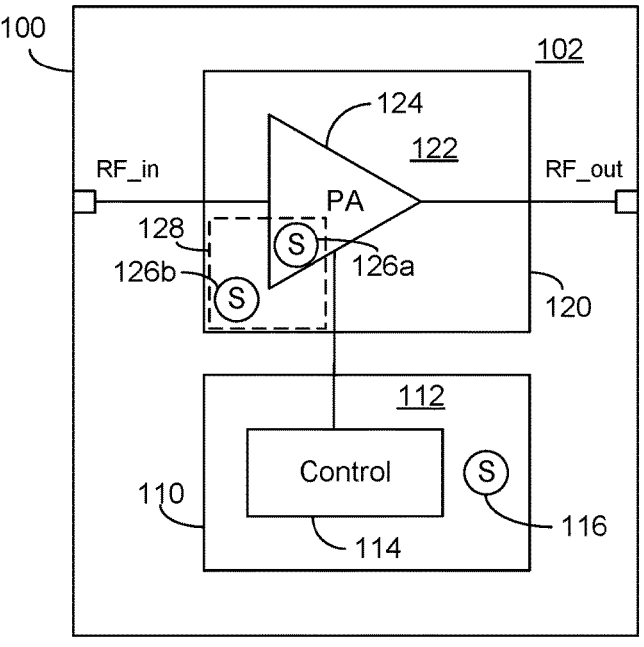
FIG. 5
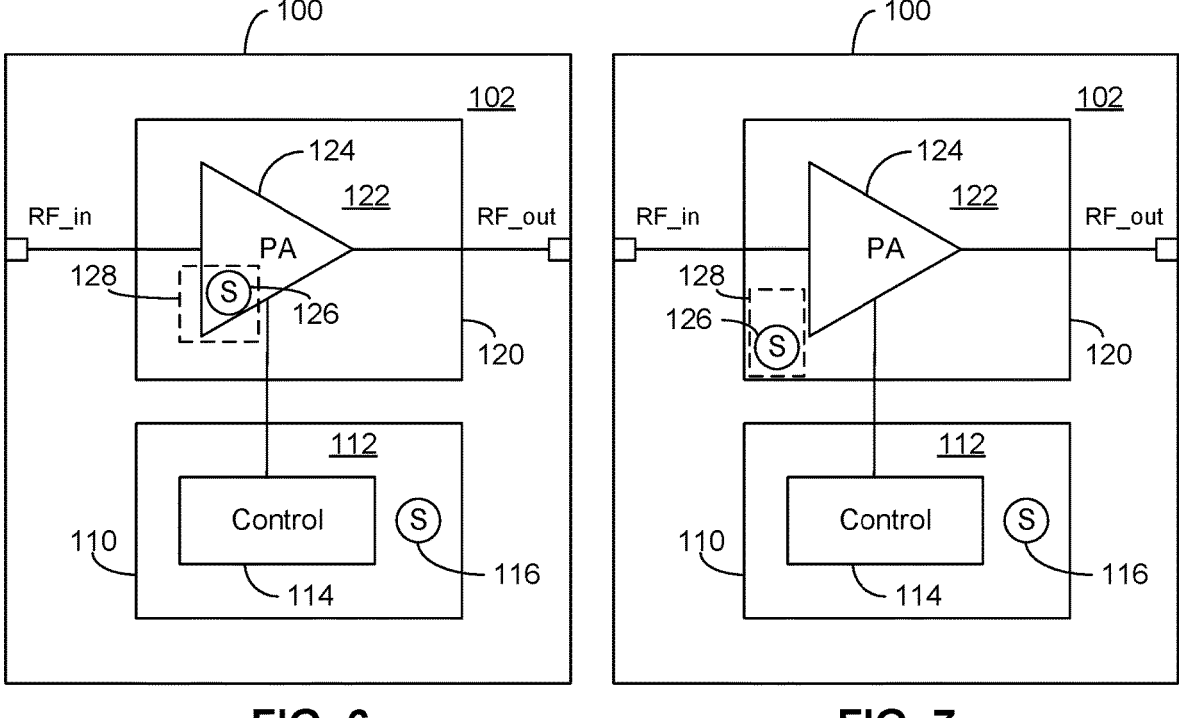
FIG. 6  FIG. 7

TEMPERATURE CORRECTION FOR RADIO-FREQUENCY CIRCUITS

CROSS-REFERENCE TO RELATED APPLICATION(S)

This application claims priority to U.S. Provisional Application No. 63/335,780 filed Apr. 28, 2022, entitled TEMPERATURE CORRECTION FOR RADIO-FREQUENCY CIRCUITS, the disclosure of which is hereby expressly incorporated by reference herein in its entirety.

BACKGROUND

Field

The present disclosure relates to temperature correction for radio-frequency circuits, and related methods and devices.

Description of the Related Art

In many radio-frequency (RF) applications, variation in operating condition, such as temperature, of an RF circuit can result in variation in performance of the RF circuit.

SUMMARY

In accordance with a number of implementations, the present disclosure relates to a radio-frequency system that includes a die having a semiconductor substrate and including a radio-frequency circuit and a sensor implemented thereon. The radio-frequency system further includes another die having a semiconductor substrate and including a control circuit for controlling the radio-frequency circuit and a sensor implemented thereon. The control circuit is configured to receive sensed information from the sensor of the die with the radio-frequency circuit and sensed information from the sensor of the die with the control circuit. The control circuit is further configured to be capable of adjusting operation of the radio-frequency circuit based on the sensed information from either or both of the sensors.

In some embodiments, the sensed information can include a temperature measurement or a change in temperature. The sensor implemented on the die with the radio-frequency circuit can be part of the radio-frequency circuit, or be located away from the radio-frequency circuit.

In some embodiments, the sensor implemented on the die with the radio-frequency circuit can be one of a plurality of similar sensors.

In some embodiments, the radio-frequency circuit can include an amplifier such as a power amplifier. The control circuit can be configured to adjust operation of the power amplifier based on the temperature measurement or a change in temperature. The adjustment of the power amplifier can include either or both of gain and phase of the power amplifier.

In some embodiments, the sensor implemented on the die with the control circuit can be configured to provide information representative of ambient temperature as a reference for the control circuit.

In some embodiments, the sensor implemented on the die with the radio-frequency circuit can be configured to provide information representative of temperature at a location of the die that affects the radio-frequency circuit.

In some implementations, the present disclosure relates to a method for operating a power amplifier. The method includes obtaining sensed temperature information from a die having a semiconductor substrate and including a power amplifier, obtaining sensed temperature information from another die having a semiconductor substrate and including a control circuit, and adjusting operation of the power amplifier based on the sensed temperature information from either or both of the die.

According to some implementations, the present disclosure relates to a radio-frequency module that includes a packaging substrate and a die mounted on the packaging substrate and including a radio-frequency circuit and a sensor implemented thereon. The radio-frequency module further includes another die mounted on the packaging substrate and including a control circuit and a sensor implemented thereon. The control circuit is configured to receive sensed information from the sensor of the die with the radio-frequency circuit and sensed information from the sensor of the die with the control circuit. The control circuit is further configured to be capable of adjusting operation of the radio-frequency circuit based on the sensed information from either or both of the sensors.

In some embodiments, the sensed information can include a temperature measurement or a change in temperature. The sensor implemented on the die with the radio-frequency circuit can be part of the radio-frequency circuit, or be located away from the radio-frequency circuit.

In some embodiments, the sensor implemented on the die with the radio-frequency circuit can be one of a plurality of similar sensors.

In some embodiments, the radio-frequency circuit can include an amplifier such as a power amplifier. The control circuit can be configured to adjust operation of the power amplifier based on the temperature measurement or a change in temperature. The adjustment of the power amplifier can include either or both of gain and phase of the power amplifier.

In some embodiments, the sensor implemented on the die with the control circuit can be configured to provide information representative of ambient temperature as a reference for the control circuit.

In some embodiments, the sensor implemented on the die with the radio-frequency circuit can be configured to provide information representative of temperature at a location of the die that affects the radio-frequency circuit.

In some implementations, the present disclosure relates to a wireless device that includes an antenna and a radio-frequency module in communication with the antenna and including a die having a radio-frequency circuit and a sensor implemented thereon. The radio-frequency module further includes another die having a control circuit and a sensor implemented thereon. The control circuit is configured to receive sensed information from the sensor of the die with the radio-frequency circuit and sensed information from the sensor of the die with the control circuit. The control circuit is further configured to be capable of adjusting operation of the radio-frequency circuit based on the sensed information from either or both of the sensors.

In some embodiments, the radio-frequency circuit can include a power amplifier, and each of the sensor of the die with the radio-frequency circuit and the sensor of the die with the control circuit can be a temperature sensor. The control circuit can be configured to adjust operation of the power amplifier based on the temperature measurement or a change in temperature.

In some embodiments, the sensor implemented on the die with the control circuit can be configured to provide information representative of ambient temperature as a reference for the control circuit, and the sensor implemented on the die with the radio-frequency circuit can be configured to provide information representative of temperature at a location of the die that affects the radio-frequency circuit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 5 shows that in some embodiments, the sensor-assembly on the die of FIG. 4 can include a sensor implemented on a die so as to be part of a power amplifier, and a sensor implemented on the same die so as to be not part of the power amplifier.

FIG. 6 shows that in some embodiments, the sensor-assembly on the die of FIG. 4 can include a sensor implemented on a die so as to be part of a power amplifier.

FIG. 7 shows that in some embodiments, the sensor-assembly on the die of FIG. 4 can include a sensor implemented on a die so as to be not part of a power amplifier.

DETAILED DESCRIPTION OF SOME EMBODIMENTS

The headings provided herein, if any, are for convenience only and do not necessarily affect the scope or meaning of the claimed invention.

In many radio-frequency (RF) applications, variation in operating condition, such as temperature, of an RF circuit can result in variation in performance of the RF circuit.

For example, an RF application can involve a digital communication technique that uses training sequence to define expected data amplitude and phase of signal to be transmitted. Once such a training sequence finished, any gain or phase change in a transmitting amplifier before the next training sequence will result in signal error, commonly measured by dynamic error vector magnitude (DEVM). Device heating is a common source of such a change involving gain and/or phase. Thus, maintaining good gain and phase control over time during the operation of the amplifier is desirable.

Figure 1:
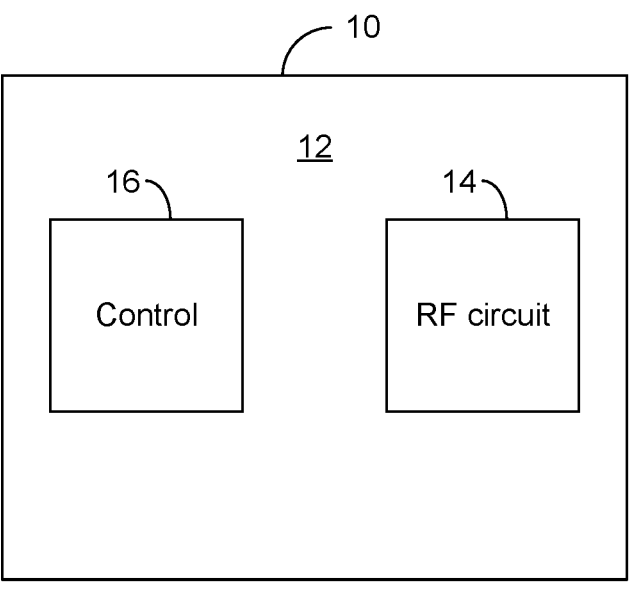
FIG. 1 shows an example of a conventional architecture for monitoring temperature and controlling operation of a radio-frequency (RF) circuit.

FIG. 1 shows an example of a conventional architecture for monitoring temperature and controlling operation of an RF circuit 14. In the example of FIG. 1, the RF circuit 14 is implemented on a semiconductor die 10 having a substrate 12, and a control circuit 16 for controlling the operation of the RF circuit 14 is also implemented on the same substrate 12. Thus, if the die 10 includes a sensor for monitoring of temperature, such information can be utilized by the control circuit 16 to adjust the operation of the RF circuit 14. However, because the control circuit 16 and the sensor associated with the RF circuit share the same substrate (12), the control circuit 16 does not have information about, for example, ambient temperature as a reference.

Figure 2:
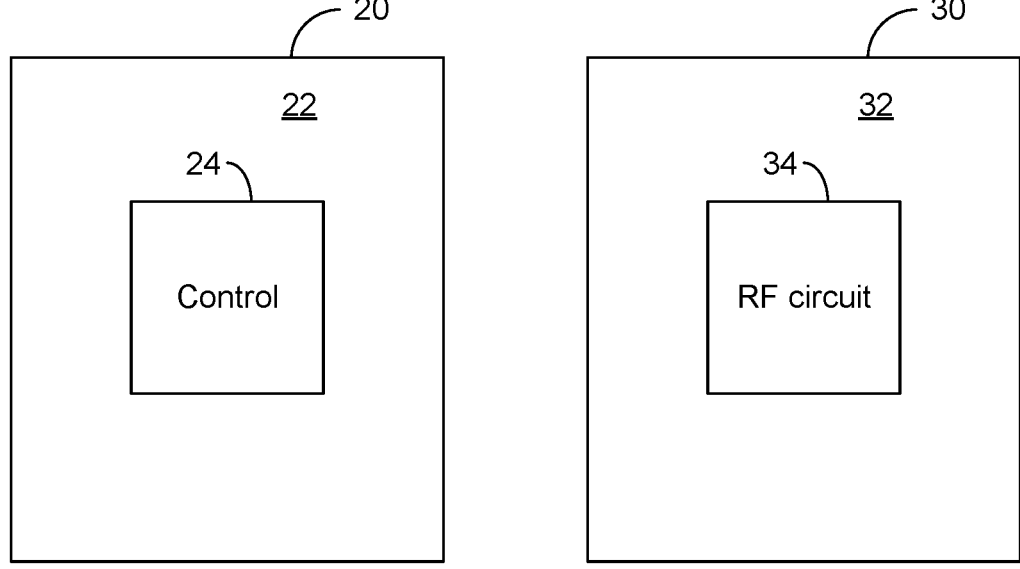
FIG. 2 shows another example of a conventional architecture for monitoring temperature and controlling operation of an RF circuit.

FIG. 2 shows another example of a conventional architecture for monitoring temperature and controlling operation of an RF circuit 34. In the example of FIG. 2, the RF circuit 34 is implemented on a semiconductor die 30 having a substrate 32, and a control circuit 24 for controlling the operation of the RF circuit 34 is implemented on a separate semiconductor die 20 having a substrate 22. Thus, if the die 20 with the control circuit 24 includes a sensor for monitoring of temperature, such information can be utilized by the control circuit 24 to adjust the operation of the RF circuit 34 on the other die 30. However, in the example of FIG. 2, the control circuit 24 does not have good measure of the RF circuit 34 temperature since the control circuit 24 and the RF circuit 34 are implemented on different die.

Figure 3:
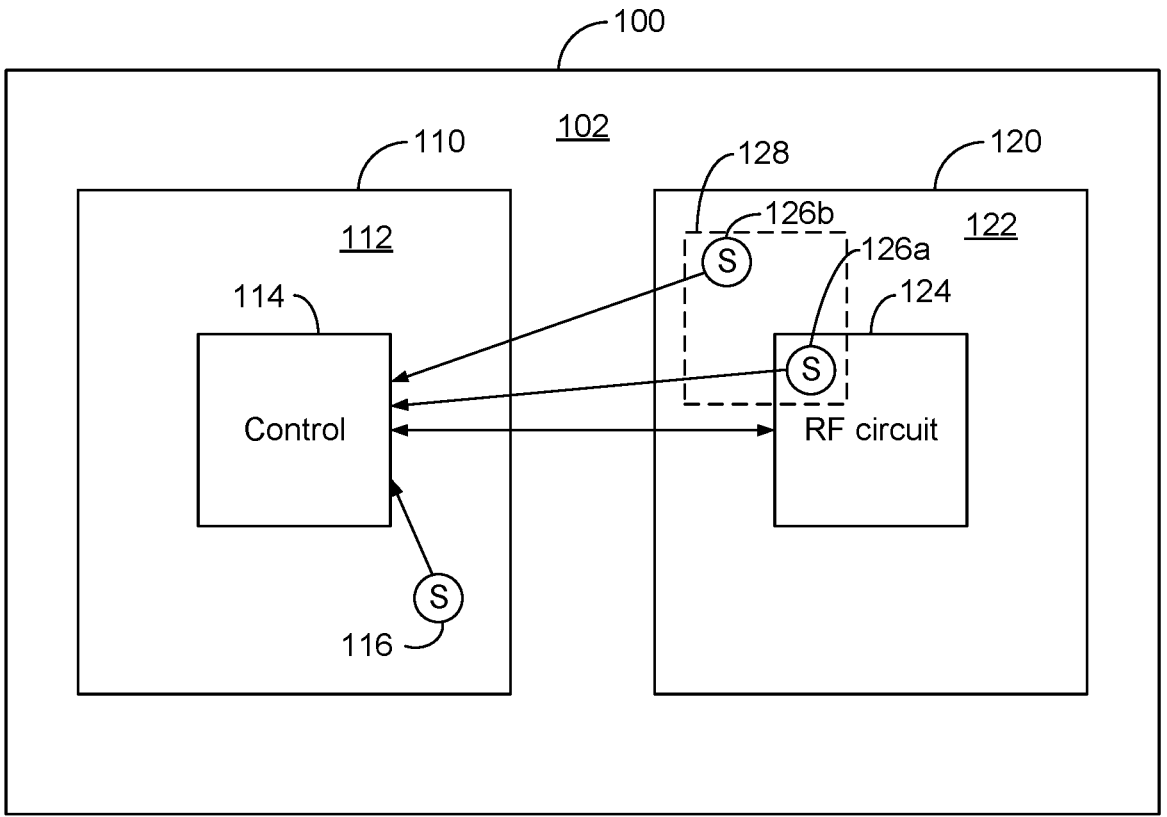
FIG. 3 shows that in some embodiments, an architecture for monitoring temperature and controlling operation of an RF circuit can be implemented with first and second semiconductor die.

FIG. 3 shows that in some embodiments, an architecture 100 for monitoring temperature and controlling operation of an RF circuit can be implemented with first and second semiconductor die 110, 120. The first die 110 can include a control circuit 114 implemented on its substrate 112, and the second die 120 can include an RF circuit 124 implemented on its substrate 122.

In some embodiments, the first die 110 with the control circuit 114 can include one or more sensors implemented at selected location(s), with each configured to sense temperature. In the example of FIG. 3, one sensor indicated as 116 is shown to be provided for the first die 110.

In some embodiments, the second die 120 with the RF circuit 124 can also include one or more sensors implemented at selected location(s), with each configured to sense temperature. In the example of FIG. 3, two sensors indicated as 126a, 126b are shown to be provided for the second die 120. More particularly, the sensor 126a can be implemented to be part of, or be closely associated, with the RF circuit 124, and the sensor 126b can be implemented to be not part of, or not be closely associated with, the RF circuit 124. Such two sensors (126a, 126b) are collectively indicated as a sensor assembly 128.

As shown in FIG. 3, each of the sensor(s) of the first die 110 and the sensor(s) of the second die 120 can be configured to provide sensed temperature information to the control circuit 114. Based on such sensed temperature information, the control circuit 114 can adjust its control signal to thereby adjust operation of the RF circuit 124.

Although the example of FIG. 3 is described in the context of a sensor associated with the RF circuit 124 and another sensor not associated with the RF circuit 124, it will be understood that other arrangements of one or more sensors can also be implemented for the second die 120.

For the purpose of description, it will be understood that a semiconductor die (or simply a die) can also be referred to as a chip. It will also be understood that a sensor can also be referred to as a sensor circuit, sensing circuit, sensor device, sensing device, sensor block or sensing block.

It is noted that with the two-chip architecture of FIG. 3, use of one or more sensors on the die 110 with the control circuit 114 (and separate from the die 120 with the RF circuit 124) allows the die 110 to maintain a good temperature reference for the control circuit 114. It is also noted that use of one or more sensors on the die 120 with the RF circuit 124 allows measurement of temperature change(s) at one or more location(s) impacting the RF circuit 124.

In some embodiments, the architecture 100 of FIG. 3 can be implemented as a packaged module. Accordingly, the architecture 100 may also be referred to herein as a module 100. In the context of such a module, the first and second die 110, 120 can be mounted on a packaging substrate 102. Although some of the examples are described herein in the context of such packaged modules, it will be understood that the architecture 100 can also be implemented in a non-packaged module configuration (e.g., first and second die 110, 120 mounted directly on a circuit board).

Figure 4:
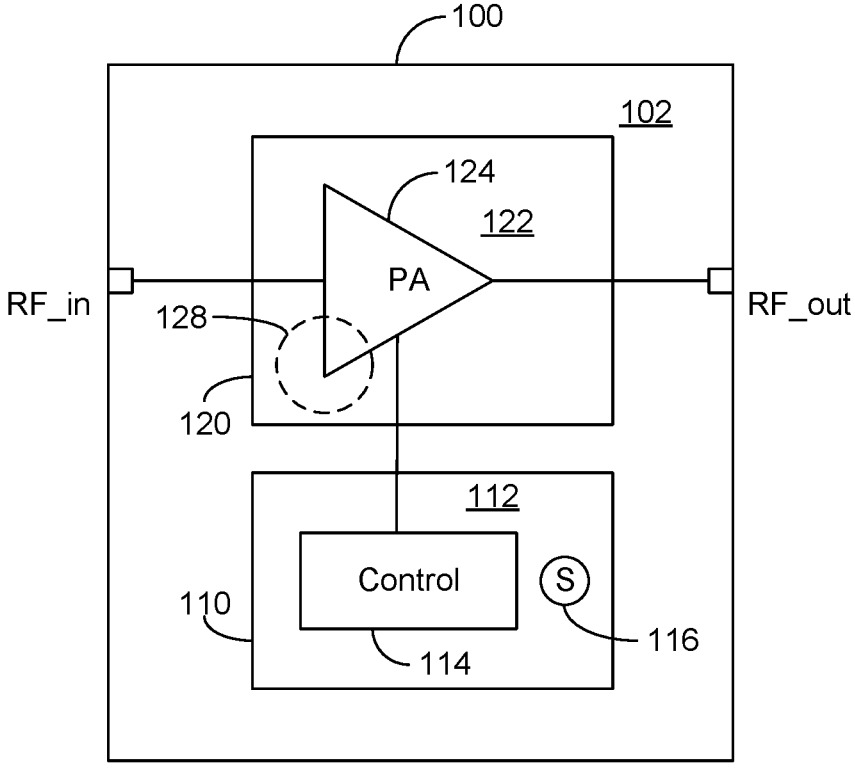
FIG. 4 shows that in some embodiments, the RF circuit of FIG. 3 can include a power amplifier.

FIG. 4 shows that in some embodiments, the RF circuit 124 of FIG. 3 can include a power amplifier 124. Such a power amplifier is shown to be implemented on a substrate 122 of a die 120, and be in communication with a control circuit 114 implemented on a substrate 112 of a separate die 110. The die 110 with the control circuit 114 is shown to include a sensor 116, and the die 120 with the power amplifier 124 is shown to include an assembly 128 of one or more sensors. As described herein, sensed temperature information from the sensor 116 of the die 110 and the sensor-assembly 128 can be provided to the control circuit 114, and the control of the power amplifier 124 can be adjusted based on such sensed temperature information.

FIG. 5 shows that in some embodiments, the sensor-assembly 128 on the die 120 of FIG. 4 can include a sensor 126a implemented on a die 120 so as to be part of a power amplifier 124, and a sensor 126b implemented on the same die (120) so as to be not part of the power amplifier 124. Each of such sensors 126a, 126b can provide sensed temperature information for the die 120 to a control circuit 114 that is implemented on a separate die 110. Similar to the example of FIG. 4, the separate die 110 with the control circuit 114 is shown to include a sensor 116 that provides sensed temperature information for the die 110 to the control circuit 114.

FIG. 6 shows that in some embodiments, the sensor-assembly 128 on the die 120 of FIG. 4 can include a sensor 126 implemented on a die 120 so as to be part of a power amplifier 124. In some embodiments, the die 120 does not include a similar sensor outside of the power amplifier 124. In the example of FIG. 6, the sensor 126 can provide sensed temperature information for the die 120 to a control circuit 114 that is implemented on a separate die 110. Similar to the example of FIG. 4, the separate die 110 with the control circuit 114 is shown to include a sensor 116 that provides sensed temperature information for the die 110 to the control circuit 114.

FIG. 7 shows that in some embodiments, the sensor-assembly 128 on the die 120 of FIG. 4 can include a sensor 126 implemented on a die 120 so as to be not part of a power amplifier 124. In some embodiments, the die 120 does not include a similar sensor within the power amplifier 124. In the example of FIG. 7, the sensor 126 can provide sensed temperature information for the die 120 to a control circuit 114 that is implemented on a separate die 110. Similar to the example of FIG. 4, the separate die 110 with the control circuit 114 is shown to include a sensor 116 that provides sensed temperature information for the die 110 to the control circuit 114.

Referring to the examples of FIGS. 3 to 7, it is noted that by using two chips for an RF circuit (e.g., power amplifier) and a control circuit, and providing cross chip sensing functionality, both of a good reference temperature and temperature variation affecting the amplifier's gain and/or phase change can be obtained and utilized by the control circuit to provide improved correction for the power amplifier.

It is also noted that by using multi-point sensing, different correction temperature coefficients can be applied to different parts of an RF circuit such as a power amplifier circuit. Also, by using multi-point sensing, different temperature change time constants at different parts of the RF circuit can be corrected.

In some embodiments, programmability functionality can be added to individual corrections, thereby providing a controller design that is more versatile and having reduced development time.

In some embodiments, multi-point sensing as described herein can allow different portions of an RF circuit to have flexibility of using different supply voltages without compromising performance. Accordingly, more versatile design and implementation such an RF circuit can be achieved.

In some embodiments, multi-point sensing as described herein can also enable measurement of thermal interdependency of multiples circuits on a chip. In some embodiments, multi-point sensing as described herein can also allow temperature correction of peripheral circuit(s) outside of an amplifier, including, for example, power detectors, regulators, and protection circuits.

For the purpose of description, multi-point sensing, multiple sensors, multiple and the like can include two-or-more-point sensing, two-or-more-sensors, two-or-more and the like. For example, a configuration having one sensor on a die with a power amplifier and one sensor on a separate die with control circuit, for a total of two sensors, can be referred to as a multi-point sensing configuration.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
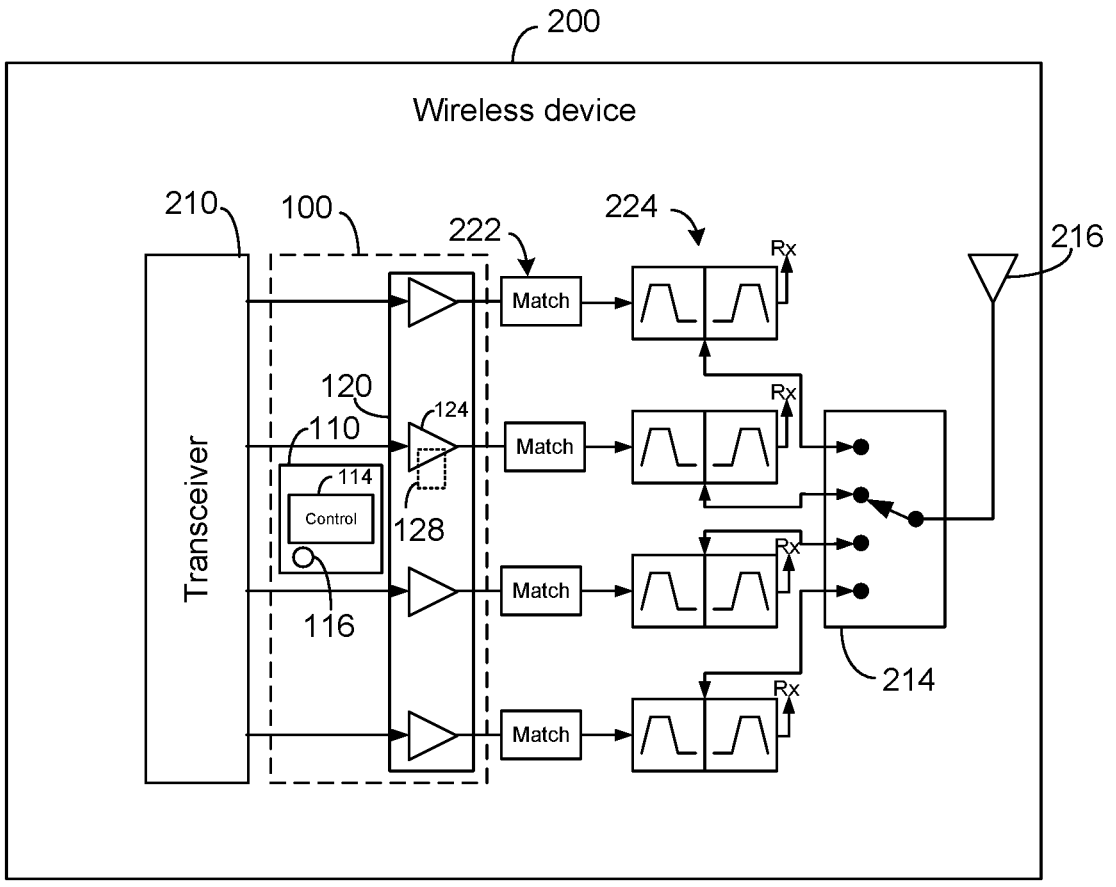
FIG. 8 depicts an example wireless device having one or more advantageous features described herein.

FIG. 8 depicts an example wireless device 200 having one or more advantageous features described herein. In some embodiments, a module 100 such as a power amplifier module can include one or more features as described herein. More particularly, such a power amplifier module can include a die 120 having one or more power amplifiers 124, and such a die can include an assembly 128 of one or more sensors as described herein. The power amplifier module can also include another die 110 having a control circuit 114 and a sensor 116 as described herein.

In the example wireless device 200, the PAs 124 are shown to provide one or more amplified RF signals to a switch 214 (via an assembly of matching circuits 222 and duplexers 224), and the switch 214 can route the amplified RF signal(s) to one or more antennas 216. The PAs 124 can receive corresponding RF signal(s) from a transceiver 210 that can be configured and operated in known manners. The transceiver 210 can also be configured to process received signals.

In the example of FIG. 8, it will be understood that the power amplification and transmission functionality as described herein can be implemented for analog or digital signals to provide wireless functionalities such as cellular, WLAN and/or other functionalities.

As described herein, temperature is an example of a condition for which one or more features of the present disclosure can be utilized. In such an example context, a temperature sensor can include any device or circuit that can be implemented on a semiconductor die or be in sufficiently close proximity to measure temperature representative of at least a portion of the semiconductor die. In some embodiments, such a temperature sensor implemented on the die can be based on a transistor, a diode or some other semiconductor structure.

In some embodiments, a temperature sensor that provides one or more features as described herein can be a resistance-based sensor, a capacitance sensor, and inductance-based sensor, or some combination thereof. In some embodiments, such a sensor can be implemented on a semiconductor die.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A radio-frequency system comprising:
a first die having a semiconductor substrate and including a radio-frequency circuit and a sensor implemented thereon, the sensor being one of a plurality of similar sensors; and
a second die having a semiconductor substrate and including a control circuit for controlling the radio-frequency circuit and a sensor implemented thereon, the control circuit configured to receive sensed information from the sensor of the first die and sensed information from the sensor of the second die, the control circuit further configured to be capable of adjusting operation of the radio-frequency circuit based on the sensed information from either or both of the sensors, the sensed information including a temperature measurement or a change in temperature.

2. The radio-frequency system of claim 1 wherein the sensor implemented on the first die is part of the radio-frequency circuit.

3. The radio-frequency system of claim 1 wherein the sensor implemented on the first die is located away from the radio-frequency circuit.

4. The radio-frequency system of claim 1 wherein the radio-frequency circuit includes an amplifier.

5. The radio-frequency system of claim 4 wherein the amplifier is configured as a power amplifier.

6. The radio-frequency system of claim 5 wherein the control circuit is configured to adjust operation of the power amplifier based on the temperature measurement or the change in temperature.

7. The radio-frequency system of claim 6 wherein the adjustment of the power amplifier includes either or both of gain and phase of the power amplifier.

8. The radio-frequency system of claim 1 wherein the sensor implemented on the second die is configured to provide information representative of ambient temperature as a reference for the control circuit.

9. The radio-frequency system of claim 1 wherein the sensor implemented on the first die is configured to provide information representative of temperature at a location of the die that affects the radio-frequency circuit.

10. A method for operating a power amplifier system, the method comprising:
obtaining sensed temperature information from a sensor implemented on a first die having a semiconductor substrate and including a power amplifier, the sensor being one of a plurality of similar sensors;
obtaining sensed temperature information from a second die having a semiconductor substrate and including a control circuit; and
adjusting operation of the power amplifier based on the sensed temperature information from either or both of the first and second die.

11. A wireless device comprising:
an antenna; and
a radio-frequency module in communication with the antenna and including a first die having a semiconductor substrate and including a radio-frequency circuit and a sensor implemented thereon, the sensor being one of a plurality of similar sensors, the radio-frequency module further including a second die having a semiconductor substrate and including a control circuit for controlling the radio-frequency circuit and a sensor implemented thereon, the control circuit configured to receive sensed information from the sensor of the first die and sensed information from the sensor of the second die, the control circuit further configured to be capable of adjusting operation of the radio-frequency circuit based on the sensed information from either or both of the sensors, the sensed information including a temperature measurement or a change in temperature.

12. The wireless device of claim 11 wherein the radio-frequency circuit includes a power amplifier, and each of the sensor of the first die and the sensor of the second die is a temperature sensor.

13. The wireless device of claim 12 wherein the control circuit is configured to adjust operation of the power amplifier based on the temperature measurement or the change in temperature.

14. The wireless device of claim 11 wherein the sensor implemented on the second die is configured to provide information representative of ambient temperature as a reference for the control circuit, and the sensor implemented on the first die is configured to provide information representative of temperature at a location of the first die that affects the radio-frequency circuit.

15. The wireless device of claim 12 wherein the adjustment of the power amplifier includes either or both of gain and phase of the power amplifier.

16. The wireless device of claim 11 wherein the radio-frequency circuit is configured to support cellular functionality.

\* \* \* \* \*